United States Patent [19]

Tanaka

[11] 4,336,601
[45] Jun. 22, 1982

[54] REWRITABLE PROGRAMMABLE LOGIC ARRAY

[76] Inventor: Mamoru Tanaka, 5-16-7, Higashi-jujo, Kita-ku, Tokyo, 114, Japan

[21] Appl. No.: 55,009

[22] Filed: Jul. 5, 1979

[30] Foreign Application Priority Data

Jul. 4, 1978 [JP] Japan .................................. 53-80531

[51] Int. Cl.³ ...................... H03K 19/20; G11C 15/00
[52] U.S. Cl. .................................. 364/900; 307/465; 364/716
[58] Field of Search ... 364/200 MS File, 900 MS File, 364/716; 307/207; 340/166 R; 328/92

[56] References Cited

U.S. PATENT DOCUMENTS

| | | | |
|---|---|---|---|
| 3,925,684 | 12/1975 | Gaskill, Jr. et al. ................ | 307/207 |
| 3,936,812 | 2/1976 | Cox et al. ........................ | 340/173 R |
| 3,974,366 | 8/1976 | Hebenstreit ...................... | 364/900 |
| 3,987,286 | 10/1976 | Muehldorf ........................ | 307/207 |
| 3,987,287 | 10/1976 | Cox et al. ....................... | 364/716 |
| 4,084,152 | 4/1978 | Long et al. ...................... | 364/716 |
| 4,124,899 | 11/1978 | Birkner et al. ................... | 307/207 |
| 4,195,352 | 3/1980 | Tu et al. ........................ | 364/900 |
| 4,207,556 | 6/1980 | Sugiyama et al. ................. | 364/716 |
| 4,233,667 | 11/1980 | Devine et al. .................... | 364/716 |
| 4,237,542 | 12/1980 | Cukier ........................... | 364/716 |
| 4,245,324 | 1/1982 | Machol et al. .................... | 364/716 |

OTHER PUBLICATIONS

"Programmable Architectural Array", E. H. Stoops, IBM Tech. Disc. Bull., vol. 19, No. 12, May 1977, p. 4569.

Primary Examiner—Gareth D. Shaw
Assistant Examiner—Eddie P. Chan
Attorney, Agent, or Firm—Carroll F. Palmer

[57] ABSTRACT

A Rewritable Programmable Logic Array (R-PLA) which can alter dynamically logic functions during processing by loading a word pattern of bit personalities to realize the specific logic functions into memory cells of Current Mode Logic (CML) is constructed by splitting a conventional Random Access Memory (RAM) of CML into two parts (SEARCH and READ parts). Each cell structure of the new R-PLA is identified with that of the conventional RAM, differing from a complicated cell structure of a flip-flop and AND gate proposed in the past. SEARCH and READ parts of the new R-PLA can operate AND functions without using special AND gates in each cell in the READ mode and can enter WRITE data from a word direction in the WRITE mode. Each part of the R-PLA comprises a two-channel selector to select READ inputs or WRITE inputs, a CML memory array and sense-drive circuits. The selector and the sense-drive circuits are controlled by means of READ/WRITE control circuits.

The logic-in-memory for the AND functions on the array can be conducted by using one of multi-emitters of a transistor in each CML memory cell and an emitter of a reference transistor in each of the sense-drive circuits in the READ mode of the new R-PLA. The new READ/WRITE control circuits let a word pattern of the bit personalities load into the CML memory cells in the word direction.

4 Claims, 13 Drawing Figures

PRIOR ART

REWRITABLE PROGRAMMABLE LOGIC ARRAY

BACKGROUND OF THE INVENTION

This invention relates to a programmable logic array which can be used as a memory circuit for performing a combinational circuit or a sequential circuit and particularly to a rewritable programmable logic array which can be applied to various circuits as an associative memory or functional memory.

In the light of rapid development of LSI semiconductor memories, design engineers have been prompted to apply similar technology also to the design of general purpose logic networks capable of performing both combinational and sequential logic functions. Though the use of memory devices as Random Access Memory (RAM) or Read Only Memory (ROM) to implement logic, it is pointed out that as the number of input variables n grows larger the memories are inefficient in providing $2^n$ word lines to implement n variable function regardless of the complexity of the function [see reference 1 cited in the appendix].

A programmable logic Array (PLA), which generally consists of a SEARCH array performing AND function and a READ array performing OR function, has been recognized as a memory device to realize combinational and sequential logic networks [see reference 1–3 cited in the appendix].

A brief description of a drawing of a prior art device is shown as follows.

FIG. 1 shows a diagram of a general Programmable Logic Array (PLA).

FIG. 2 is a 2-bit adder used as an example circuit of PLA representation.

FIG. 3 depicts a PLA representation of the 2-bit adder in FIG. 2.

FIG. 4 represents a read-only type of a bipolar PLA and FIG. 5 shows a diagram of a read/write type of prior art PLA with the complexity of the cell construction.

As shown in FIG. 1, a Programmable Logic Array (PLA) is based on the so-called naked PLA which consists of a SEARCH array and a READ array. When p-bit decoders are used as the bit partitioning networks in a general symmetric PLA, the number of the partitioned bit lines, N, and the number of cells, $S_p$, are given respectively as follows:

$$N = 2^p \times (n/p) \tag{1}$$

$$S_p = 1 \times (N + m) \tag{2}$$

Here, n, m and l are the number of input lines, output lines and word lines respectively in the PLA.

As the circuit example for the PLA representation, the 2-bit adder shown in FIG. 2 is used in this invention. The 2-bit adder accepts four input variables $X_0$, $X_1$, $X_2$ and $X_3$, and generates outputs $F_0$, $F_1$ and $\overline{C}_{out}$, which are the zero-order and first-order sums and a carry respectively. The three Boolean equations for $F_0$, $F_1$ and $\overline{C}_{out}$ may be written as $$F_0 = X_1 \ominus X_0 \tag{3}$$

$$F_1 = (X_1 \cdot X_0) \ominus X_2 \ominus X_3 \tag{4}$$

$$\overline{C}_{out} = \overline{X_3 \cdot X_2 \cdot (X_1 \cdot X_0 \vee X_3 \ominus X_2)} \tag{5}$$

where the symbols $\cdot$, $V$, $\ominus$ and $^-$ represent the operations of AND, OR, EXCLUSIVE-OR and INVERT respectively.

The PLA representation of the 2-bit adder is shown in FIG. 3. Two 2-bit decoders are used as the bit partitioning networks.

Let $B_i(i=0,1,\ldots,7)$, $W_j(j=0,1,2,3)$ and $Z_k(k=0,1,2)$ be Boolean variables for bit lines $b_i$, word lines $w_j$ and output bit lines $z_k$ respectively, $W_j$ and $Z_k$ are given by $$W_0 = B_1 \cdot B_2, \tag{6}$$

$$W_1 = (B_0 \cdot B_1 \cdot B_2) \cdot (B_4 \cdot B_7),$$

$$W_2 = B_3 \cdot B_5 \cdot B_6,$$

$$W_3 = B_4 \cdot B_5 \cdot B_6,$$

$$Z_0 = W_0, \tag{7}$$

$$Z_1 = W_1 V W_2,$$

$$Z_2 = W_1 V W_3.$$

Compared with the RAM or the ROM, the PLA is expected to be more efficient in its silicon area requirements, though the cell number of the PLA varies drastically as a function of the partitioning for the input decorders [see reference 1 cited in the appendix].

Historically, a read-only type of PLA, which generates specific Boolean output functions by open-circuiting or short-circuiting some cells at intersections of bit lines and word lines on the array, has been widely used in the market as a Field-PLA or a Mask-PLA.

But, for a read/write type of PLA, the ideal memory cell to perform the 'bit personality' to realize specific logic functions [see reference 1 cited in the appendix] and to be rewritable easily is not yet available, though the concepts are already proposed as a functional memory [see reference 2 cited in the appendix] with writable storage cells capable of holding a binary 1, a binary 0 and a DON'T CARE, or a PLA [see reference 1 cited in the appendix] with use of small memory cell and NAND gate at each intersection of bit lines and word lines. The latter PLA is shown in FIG. 5. But, such a PLA is inefficient in the complexity of the cell constructions And interconnections. Also, I proposed in Japanese patent application No. 53-78411 filed on June, 1978 that a rewritable PLA can be constructed by using simplified Current Mode Logic (CML) memory cells. But, the disadvantage of the rewritable PLA is in that in the SEARCH part bit personalities to realize specific logic functions can not be written from the work direction.

SUMMARY OF THE INVENTION

An object of this invention is to provide a rewritable PLA of CML type in which bit personalities to specific logic functions can be written and changed word by word.

The Rewritable PLA (R-PLA) is mainly consisted of a SEARCH part performing NOR function and a READ part performing NOR function. The two parts have the same configurations. That is, the SEARCH (READ) part consists of a two-channel selector with a READ input and a WRITE input, a memory array with bistable Current Mode logic (CML) memory cells at all intersections of bit (word) lines and pairs of sense-drive word(bit)lines, and a set of sense-drive circuits with a DRIVE input and READ output. The READ output lines of the SEARCH part are connected to the READ input lines of the READ part. The input bit partitioning networks [see reference 1 cited in the appendix] are connected to the READ input lines of the SEARCH part. READ/WRITE control circuits and a WRITE address decoder are added in the R-PLA.

For the R-PLA, bit personalities (contents of the CML memory cells) to realize specific logic functions are easily loadable and dynamically changed word by word during processing. The R-PLA is densed pachaged by means of the simplicity of the cell constructions and the regularity of interconnections. The R-PLA is constructed by splitting the conventional Random Access Memory (RAM) using CML memory cells into two parts. Therefore, each cell structure of the new R-PLA is identified with that of the conventional RAM. Because of the identification, the comparison for the number of cells between the new R-PLA and the RAM becomes possible according to historical discussions of the PLA and the memory in [see reference 1 cited in the appendix].

The R-PLA will be applicable as a maskable associative memory or a functional memory to several digital systems, especially to a computer with a dynamic microprogramming [see reference 4 cited in the appendix].

DETAIL DESCRIPTION OF THE INVENTION

Now in detail are discussed the architecture and READ/WRITE operations of the Rewritable Programmable Logic Array (R-PLA) of CML type in which bit personalities to realize specific logic functions can be changed from the word direction.

First, the architecture and logical operations of the R-PLA are discussed.

Figure 6:
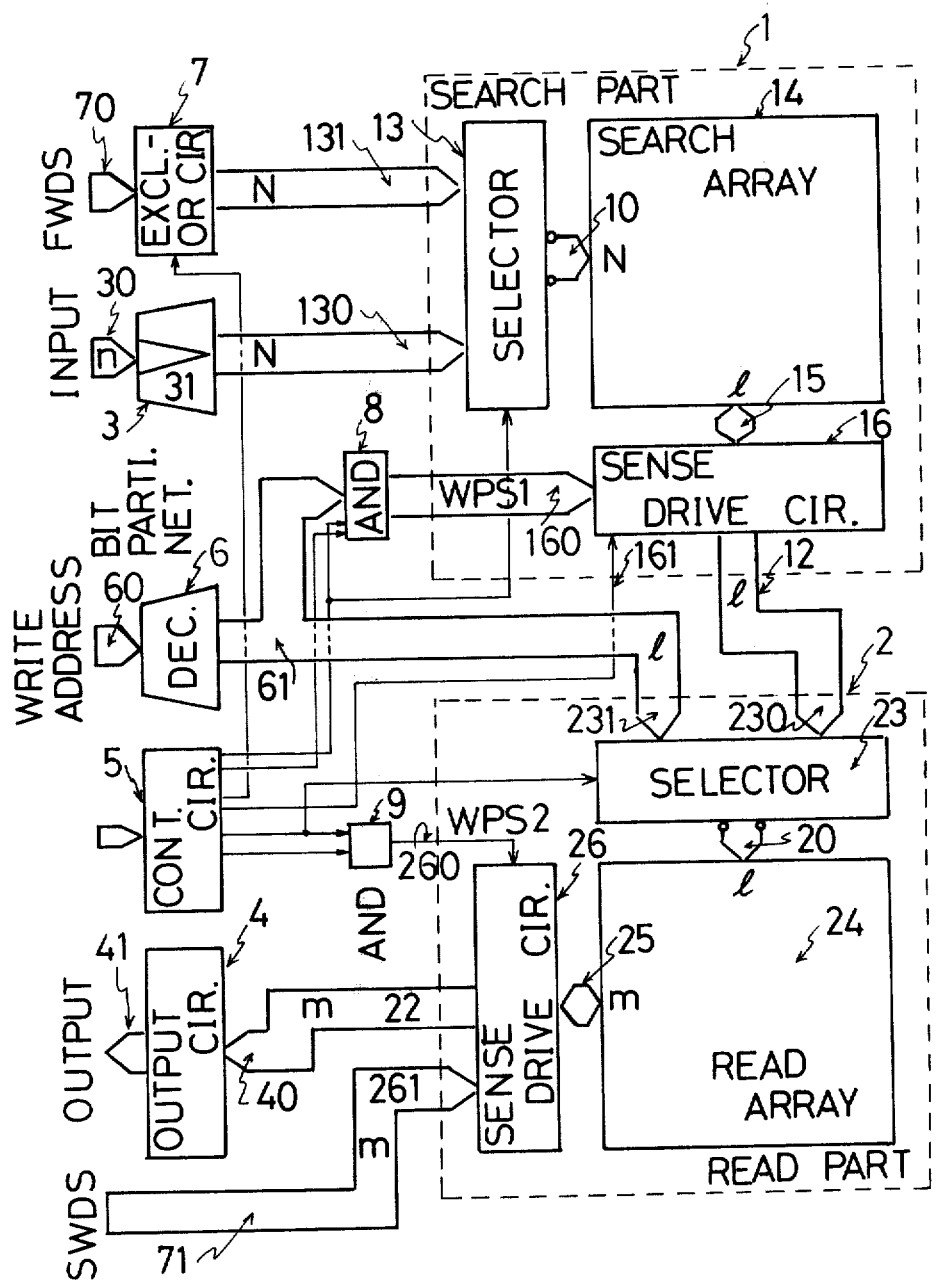
FIG. 6 shows a block diagram of the Rewritable PLA (R-PLA) disclosed in this invention.

As shown in the block diagram of FIG. 6, a general R-PLA disclosed in this invention is based on the connection of a SEARCH part 1 performing NOR operation and a READ part 2 performing NOR function. Each of the parts 1(2) consists of a two-channel selector 13(23) with READ/WRITE inputs 130(230),131(231) and inverted output 10(20), an AND array 14(24) comprised of CML memory cells, and a set of sense-drive circuits 16(26) with the DRIVE input 161(261) and READ output 12(22). The READ output lines 12 of the SEARCH part 1 are connected to the READ input lines 230 of the READ part 2. The bit partitioning networks 3 to receive n input signal lines 30 as well as to output N partitioned bit lines 130 and the output circuit 4 with m output lines 41 are connected to the READ input lines 130 of the SEARCH part 1 and the READ output lines 22 of the READ part 2 respectively. There exist l column words, each of which consists of a pair of sense-drive word lines 15 on the SEARCH array 14 and a word lines 20 on the READ array 24. The R-PLA also has a WRITE address decoder 6 to address one of the column words in the WRITE mode and has READ/WRITE control circuits containing a set of EXCLUSIVE-OR circuits 7 etc.

Figure 7:
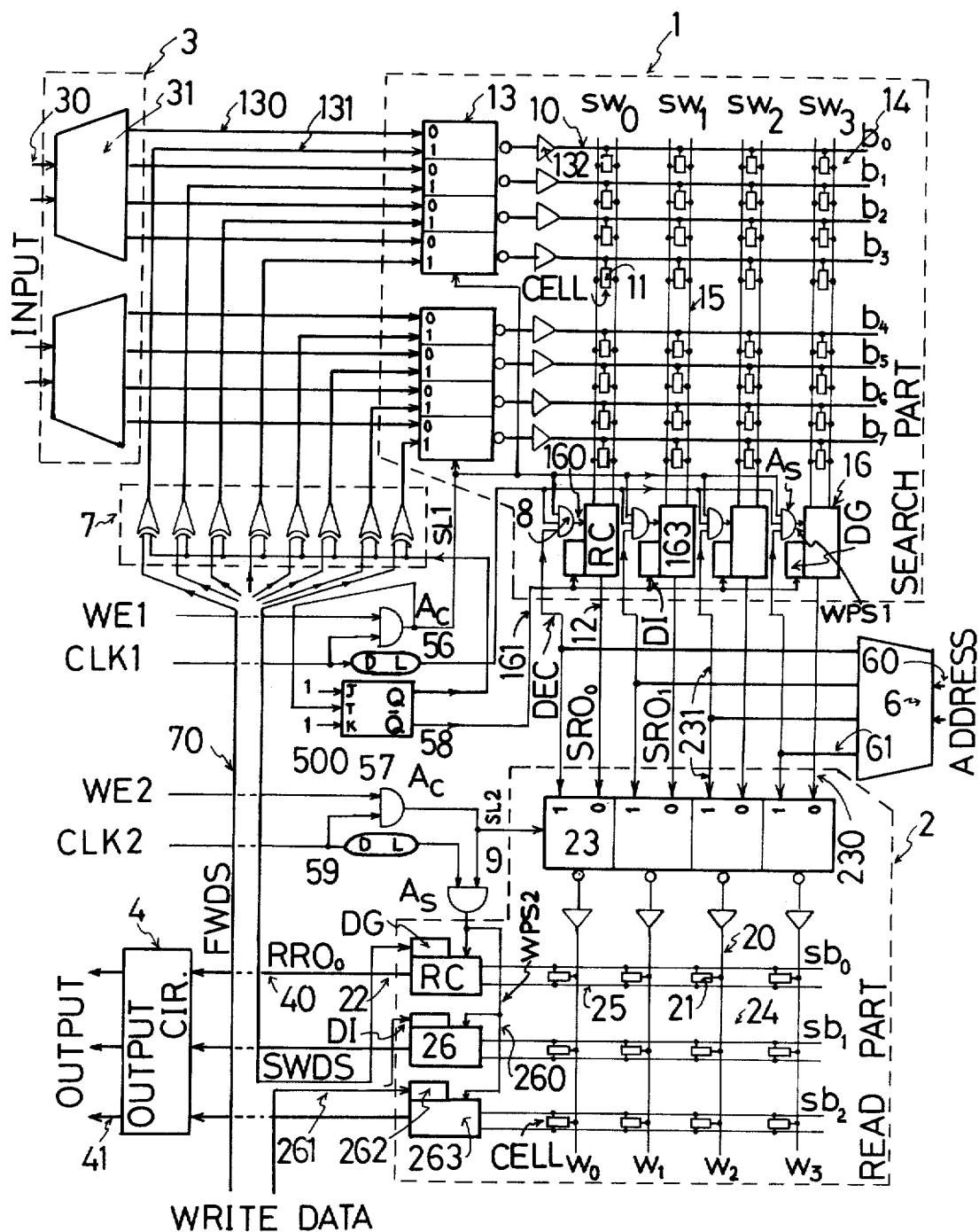
FIG. 7 shows a detail diagram of the R-PLA disclosed in this invention.

FIG. 7 shows the detail diagram of the R-PLA for $n=4$, $N=8$, $l=4$ and $m=3$, in which there exist the SEARCH part 1, the READ part 2, two 2-bit input decoders 3, a WRITE address decoder 6, READ/WRITE control circuits containing a set of EXCLUSIVE-OR circuits 7 etc. and an output circuit 4.

Bit (word) lines 10 (20) on the SEARCH (READ) array 14 (24) run in the row (column) direction from the inverted outputs of the two-channel selectors 13 (23) which select the WRITE input signals in the WRITE mode or the READ input signals in the READ mode. Pairs of sense-drive word (bit) lines 15 (25) on the SEARCH (READ) array 14 (24) run to column (row) direction and connect at the terminals to the sense-drive circuits 16 (26). Each of the sense-drive circuits 16 (26) may receive a write pulse signal (WPS) from AND gate $A_s$ and a DRIVE input signal (DI) at the DRIVE gate (DG) in the WRITE mode, or generate a READ output signal 12 (22) from the reference circuit (RC) in the READ mode.

In the R-PLA shown in the FIG. 7, when the WRITE ENABLE control signals designated by WE1 and WE2 are logical 0's, the R-PLA is in the READ mode. In the READ mode of the R-PLA, the two-channel selectors 13 (23) are controlled to select the READ input signals 130 (230) by means of the logical 0 at the select control lines SL1 and SL2, and all sense-drive circuits 16 (26) are controlled to generate the results of AND-functions performed on the arrays to the READ output lines 12 (22) by means of the logical 0's at the write pulse signal lines WPS1 and WPS2.

The READ operation of the SEARCH (READ) part 1 (2) of the R-PLA is performed such that, when there exists one logical 0 at least in the contents of the CML memory cells 11 (21) on the each pair of sense-drive word (bit) lines 15 (25) and on a plurality of bit (word) lines 10 (20) activated to logical 0's according to the logical 1's of the READ input signals 130 (230) of the two-channel selectors, 13 (23), the logical 0 is generated at the corresponding READ output line 12 (22) of the sense-drive circuit 16 (26).

Figure 1:
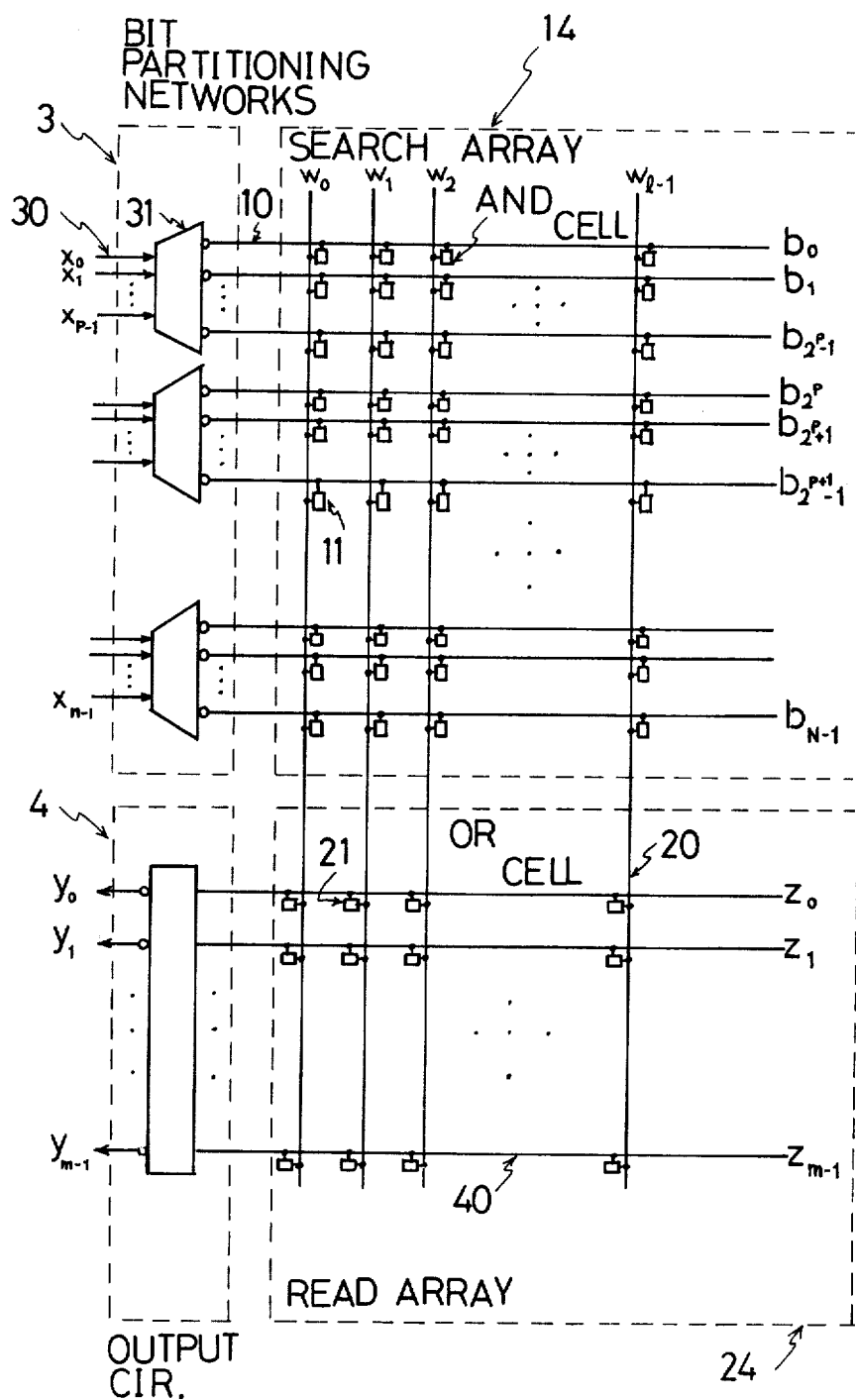
Figure 2:
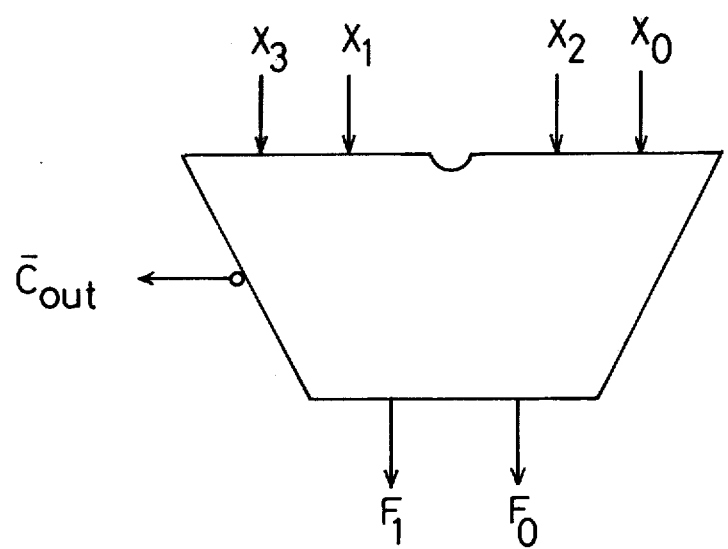
Figure 3:
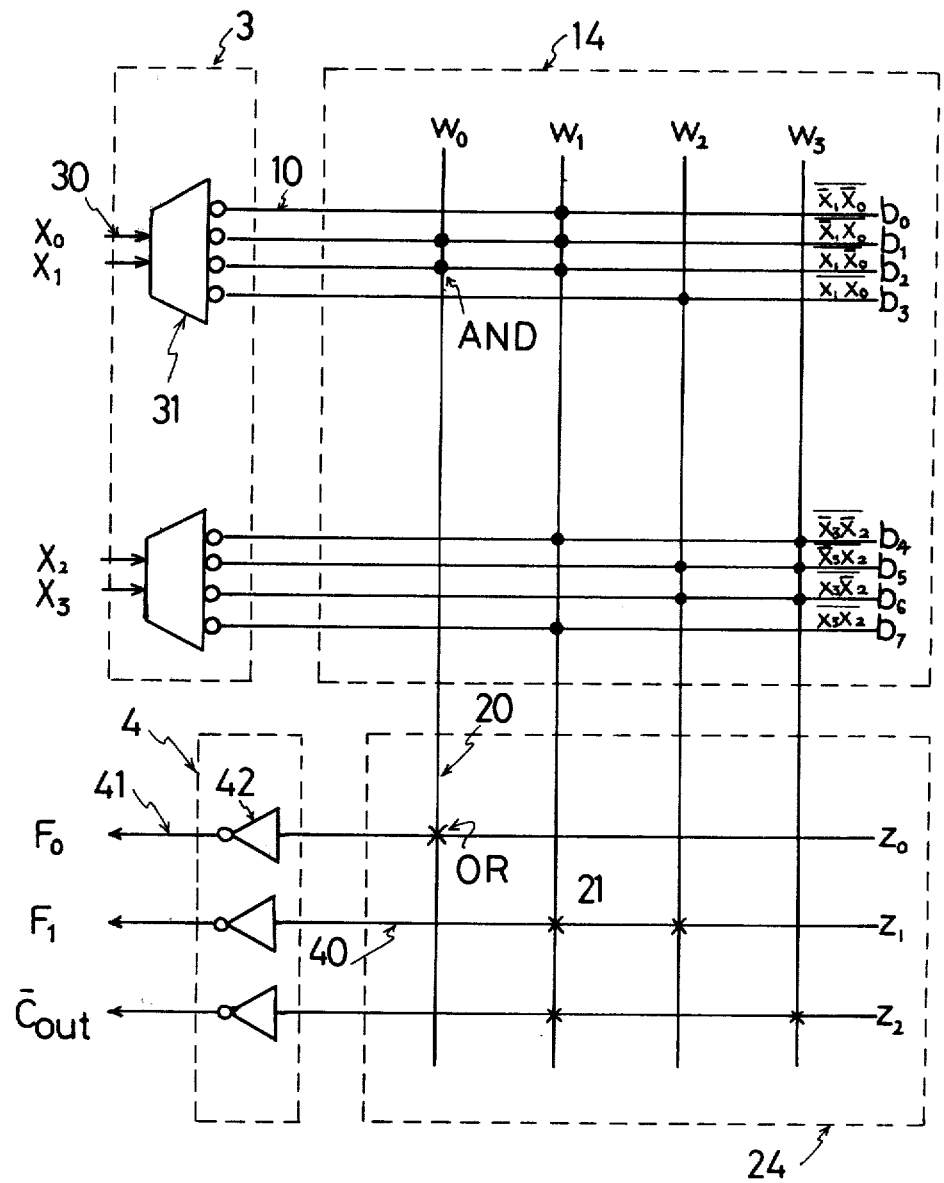
Figure 4:
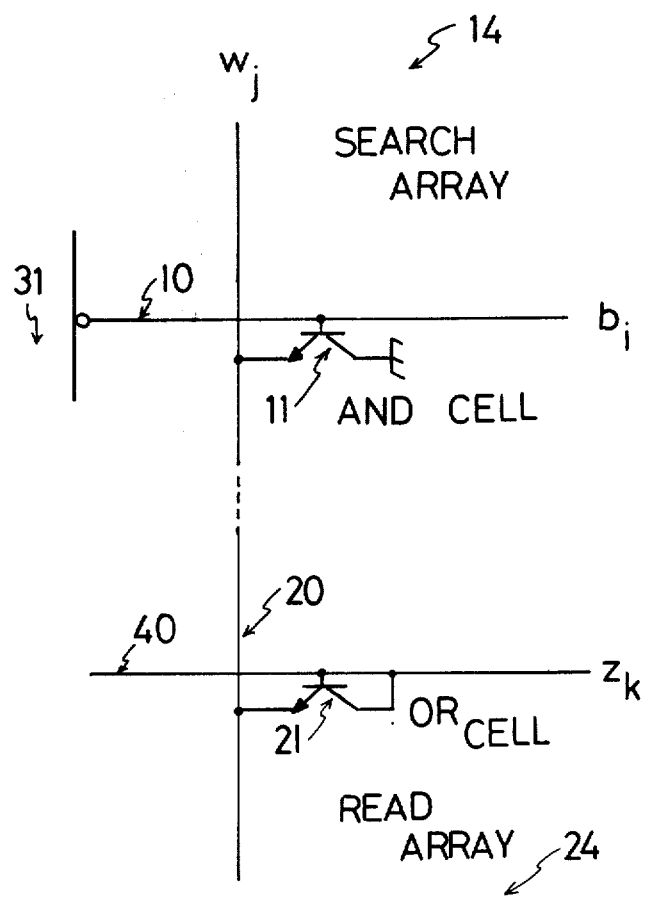
Figure 5:
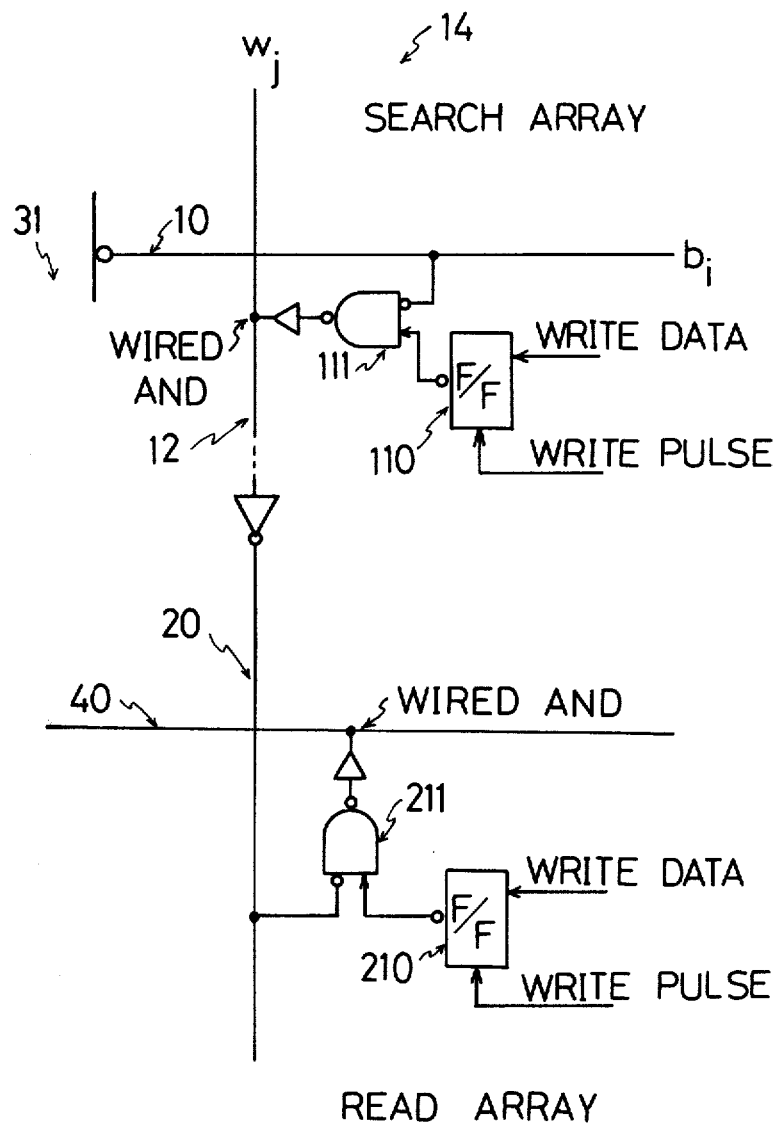
Figure 8:
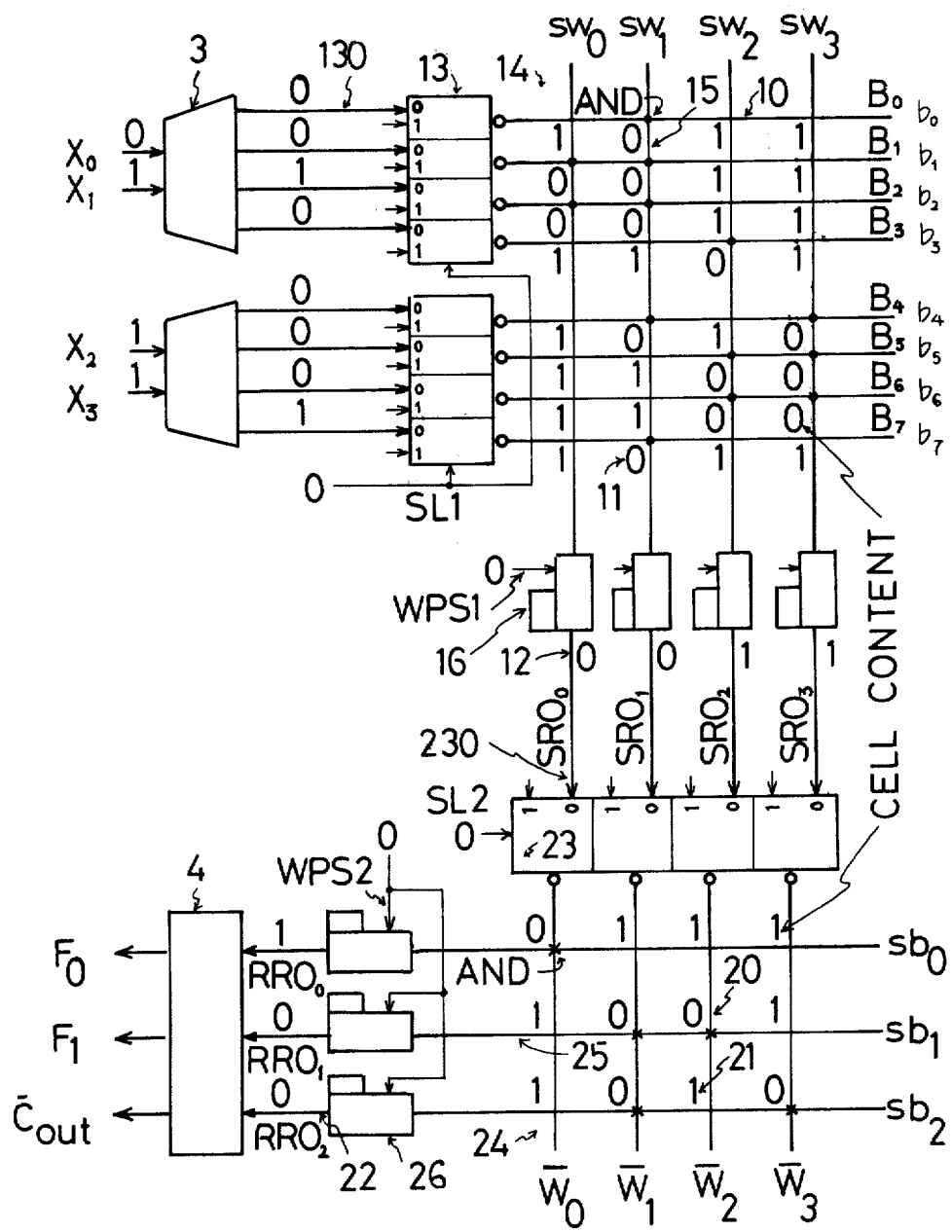
FIG. 8 shows a representation for the READ mode of the R-PLA disclosed in this invention.

In order to illustrate the READ operation of the R-PLA, the 2-bit adder shown in the FIG. 2 is used. When the 2-bit adder is already realized by the R-PLA of FIG. 7, the simplified representation for the READ mode of the R-PLA is shown in FIG. 8. Two bit partitioning networks receive the input signals $x_0x_1=01$ and $x_2x_3=11$ and output the partitioned bit signals $\{0,0,1,0\}$ and $\{0,0,0,1\}$ respectively. As the selectors 13 of the SEARCH part 1 are controlled to select signals of the READ input lines 130 connected to the partitioned bit lines by means of the logical 0 at the line SL1, the inverted output signals 10 of the two selectors 13 are $\{1,1,0,1\}$ and $\{1,1,1,0\}$ respectively. In the SEARCH array 14, bit personalities (i.e., contents of the CML memory cells) are already set as shown in FIG. 8. The bit lines $b_i$ ($i=0,1,\ldots,7$) entering from the inverted outputs 10 of the selectors 13 are 'connected' by means of AND-cells with the content 0's to pairs of sense-drive word lines $sw_j$ (j=0,1,2,3) at intersections indicated by 0 symbols corresponding to · symbols in FIG. 3. The sense-drive circuits 16 of the SEARCH part 1 are controlled to generate the results of the AND-functions performed on the SEARCH array 14 by means of the logical 0 at the line WPS1.

Let $B_i$ (i=0,1, ..., 7) and $W_j$ (j=0,1,2,3) be Boolean variables for bit lines $b_i$ (i=0,1, ..., 7) and READ output lines $SRO_j$ (j=0,1,2,3) of the SEARCH part 1 respectively, $W_j$ are given by equations (6). For $\{B_0,B_1,B_2,B_3\} = \{1,1,0,1\}$ and $\{B_4,B_5,B_6,B_7\} = \{1,1,1,0\}$, $\{W_0,W_1,W_2,W_3\}$ are given by $\{0,0,1,1\}$.

Note that when there exists at least one logical 0 in the contents of the CML memory cells 11 on a pair of sense-drive lines, $sw_j$, and on two bit lines $b_2$ and $b_7$ activated to logical 0's, logical 0 is generated at the READ output lines 12 as $SRO_0$ and $SRO_1$.

As the two-channel selector 23 of the READ part 2 is controlled to select signals of the READ input lines 230 connected to the READ output lines $SRO_j$ (j=0,1,2,3) of the SEARCH part 1 by means of the logical 0 at the line SL2, the inverted output signals 20 of the selector 23 of the READ part 2 are {1,1,0,0}. In the READ array 24 bit personalities are already set shown in FIG. 8. The word lines $w_j$ (j=0,1,2,3) entering from the inverted outputs 20 of the selector 23 are 'connected' by means of AND-cells with the content 0's to a pair of sense-drive bit lines, $sb_k$ (k=0, 1,2) at intersections indicated by 0 symbols corresponding to x symbols in FIG. 3. The sense-drive circuits 26 of the READ part 2 are controlled to generate the results of AND-functions performed on the array 24 to the READ output lines $RRO_k$ (k=0,1,2) by means of the logical 0 at the line WPS2.

Let $\overline{W}_j$ (j=0,1,2,3) and $\overline{Z}_k$ (k=0,1,2) be Boolean variables for word line $w_j$ (j=0,1,2,3) and READ output lines $RRO_k$ (k=0,1,2) respectively, $\overline{Z}$ (k=0,1,2) are given by $$\overline{Z}_0 = \overline{W}_0,$$
$$\overline{Z}_1 = \overline{W}_1 \cdot \overline{W}_2, \quad (8)$$
$$\overline{Z}_2 = \overline{W}_1 \cdot \overline{W}_3$$

Equations (8) are identified with equations (7). For $\{\overline{W}_0,\overline{W}_1,\overline{W}_2,\overline{W}_3\} = \{1,1,0,0\}$, $\{\overline{Z}_0,\overline{Z}_1,\overline{Z}_2\}$ are given by $\{1,0,0\}$.

Note that when there exists at least one logical 0 in the contents of the CML memory cells 21 on a pair of sense-drive bit lines, $sb_k$, and on two word lines $w_2$ and $w_3$ activated to logical 0's, logical 0's are generated at the READ output lines 22 as $RRO_1$ and $RRO_2$.

As it is defined in this invention that each of the two parts 1 (2) in the R-PLA performs the logic in the form of NOR (i.e., INVERT-AND) operations, each output Boolean function at the READ output line $RRO_j$ of the READ part 2 is realized in the 'product of sums' for the READ input variables 130 of the SEARCH part 1.

In the R-PLA shown in FIG. 7, when WRITE ENABLE control signals designated by WE1 and WE2 are logical 1's, the R-PLA is in the WRITE mode. In the WRITE mode of the R-PLA, the two-channel selectors 13 (23) are controlled to select the WRITE input signals 131 (231) by setting the logical 1's at the select control lines SL1 and SL2 during the clock (CLK1 or CLK2) width time, and at least one of sense-drive circuits 16 (26) is controlled to start the WRITE operation by setting logical 1's at lines WPS1 and WPS2 during the write pulse width. The write pulse is made by two AND gates ($A_s$ and $A_c$) and the delay line (DI).

The WRITE input lines 131 of the SEARCH part 1 are connected to the output lines of the EXCLUSIVE-OR circuits 7. The EXCLUSIVE-OR circuits 7 send the first WRITE data signals (FWDS) to the output lines when the TRUE output signal Q of the J/K flip-flop 500 in the control circuits is logical 0, and send the inverted signals of the FWDS to the output lines when the TRUE output signal Q is logical 1. The JK input lines and trigger input line of the J/K flip-flop 500 are connected to the lines fixed to logical 1's and the output line of the AND gate $A_c$ with the inputs WE1 and CLK1 respectively. Therefore, the TRUE output signal Q is inverted in turn by the High-to-Low transition of the clock CLK1 during WE1 = 1. According to a plurality of logical 1's of the WRITE input signals 131, a plurality of bit lines 10 on the SEARCH array 14 are activated to logical 0's. In the SEARCH part 1, only one sense-drive circuit 16 addressed by the WRITE address decoder 6 can receive the write pulse signal of logical 1 at the line WPS1. Because each WPS1 line is connected to the output line of each AND gate $A_s$ with the input signals of WE1·CLK1, DCLK1 (delay clock) and DEC (the decoded output of the WRITE address decoder). All DRIVE input lines (DI) of the sense-drive circuits 16 in the SEARCH part 1 are connected in common to the FALSE output $\overline{Q}$ of the J/K flip-flop 500. Therefore, only the one sense-drive circuit 16 having just received the write pulse signal starts to drive the logical 1 when the non-inverted signals of the FWDS are sent to the WRITE input lines 131 or drive the logical 0 when the inverted signals of the FWDS are sent to the WRITE input lines 131.

The WRITE input lines 231 of the READ part 2 are connected to the decoded output lines 61 of the WRITE address decoder 6. Therefore, only one word line 20 on the READ array 24 activates to logical 0. In the READ part 2, all of the sense-drive circuits 26 can receive the write pulse signal of logical 1 at the same time at the line WPS2, because all WPS2 lines are connected in common to the output of the AND gate $A_s$ with inputs of WE2·CLK2 and DCLK2 (delay clock). Also, each DRIVE input line 71 off the sense-drive circuits 26 in the READ part 2 comes independently from the second WRITE data signals (SWDS). Therefore, all sense-drive circuits 26 just having received the write pulse signals start to drive the SWDS at the same time.

The WRITE operation of the SEARCH (READ) part 1 (2) of the R-PLA is performed such that, when at least one of the sense-drive circuits 16 (26) receives the write pulse signal, the DRIVE input signal 161 (261) inputted at the sense-drive circuit 16 (26) is written, through a pair of sense-drive word (bit) lines 15 (25), into at least one of CML memory cells 11 (21) on the bit (word) lines 10 (20) activated to logical 0's according to the logical 1's of the WRITE input signals 131 (231) selected by the selectors 13 (23).

Figure 9:
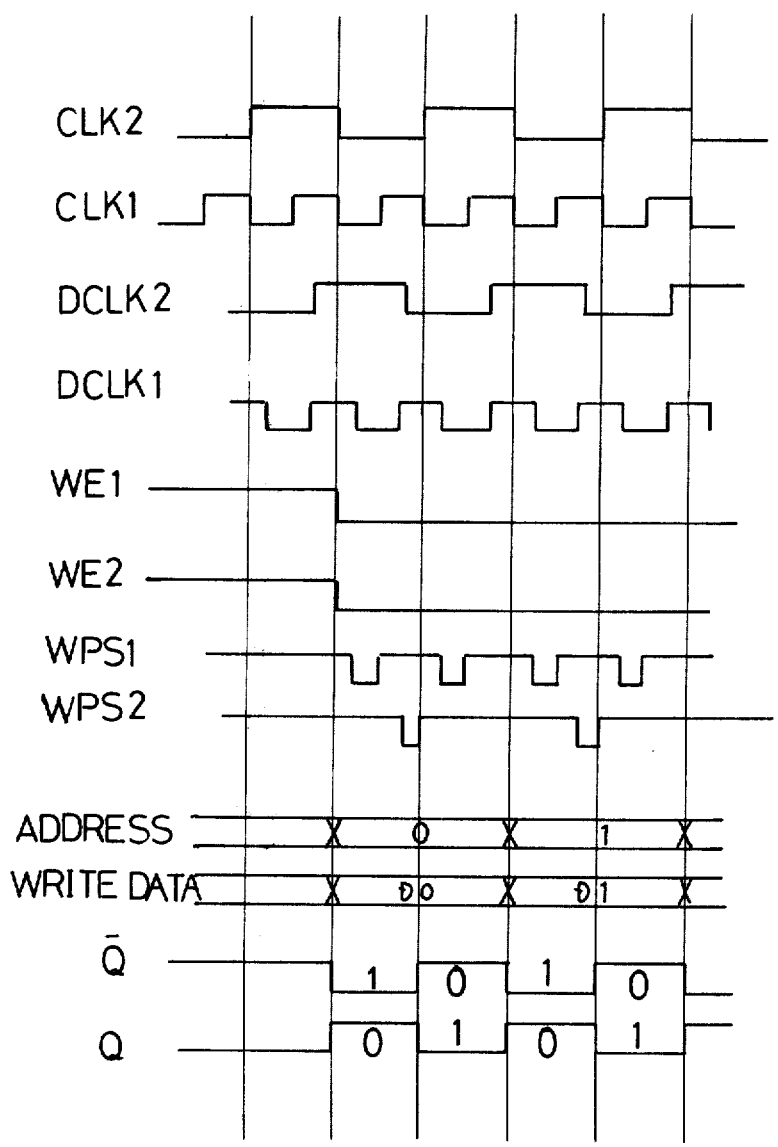
FIG. 9 shows a timing chart for the WRITE mode of the R-PLA disclosed in this invention.

When the clock CLK1 has twice as frequency as the clock CLK2, the timing chart for each signal in the WRITE mode of the R-PLA is shown in FIG. 9.

Figure 10:
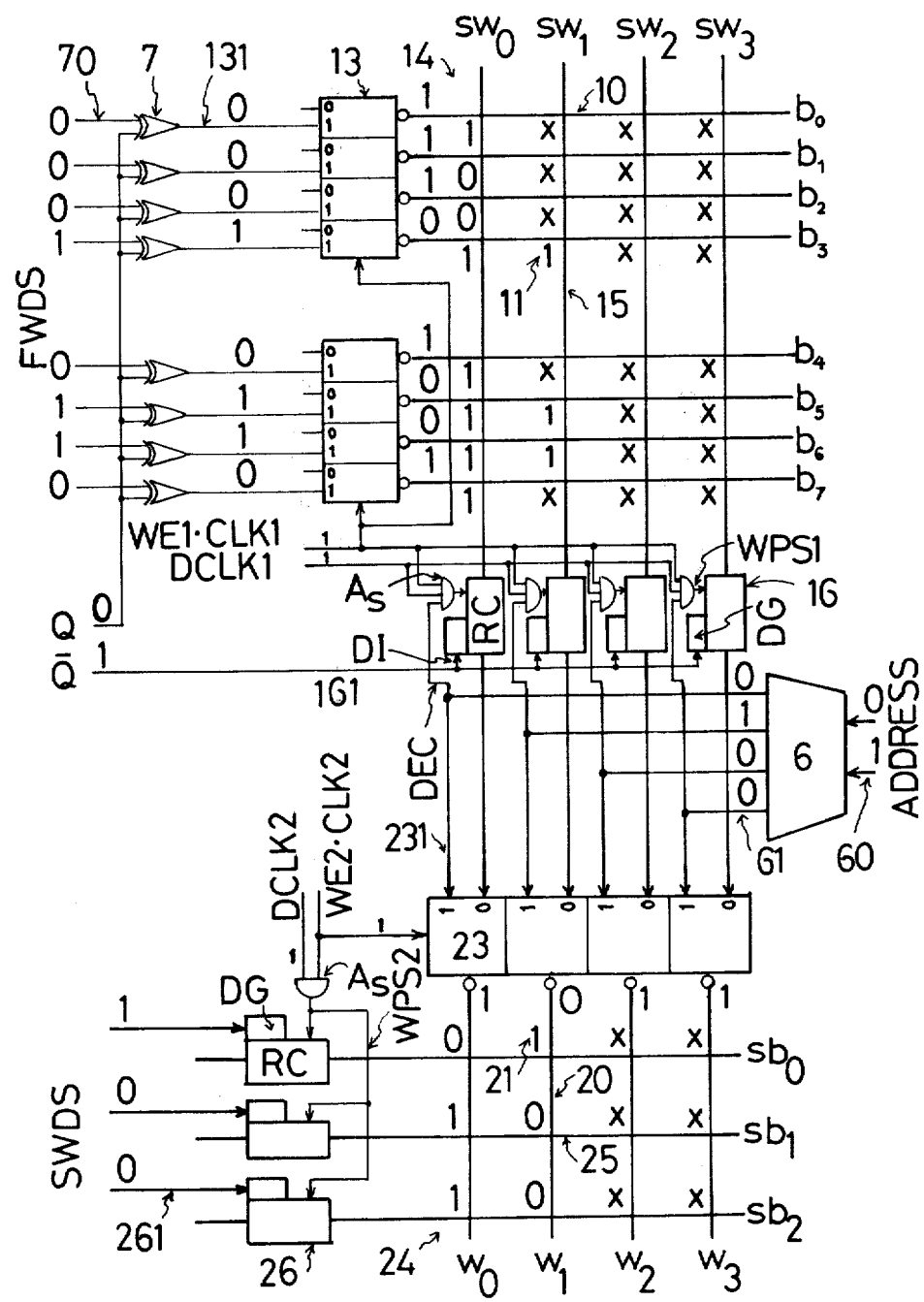
FIG. 10 shows a representation for the WRITE mode of the R-PLA disclosed in this invention.

In order to illustrate the WRITE operation of the R-PLA, the 2-bit adder shown in FIG. 2 is used again. The simplified representation for the WRITE mode of the R-PLA is shown in FIG. 10. Now, it is defined that each column word $CW_j$ (j=0,1,2,3) consists of the contents of the CML memory cells 11 on a pair of sense-drive word lines $sw_j$ (j=0,1,2,3) in the SEARCH array 14 and the contents of the CML memory cells 21 on the corresponding word line $w_j$ (j=0,1,2,3) in the READ array 24. Then, the first column word $CW_0$ is already written as $CW_0 = \{1,0,0,1\}, \{1,1,1,1\}$ and $\{0,1,1\}$.

The second column word $CW_1$ as $CW_1 = \{0,0,0,1\}, \{0,1,1,0\}$ and $\{1,0,0\}$ is about to be written into the CML memory cells on the line $sw_1$ and the line $w_1$. Other two column words $CW_2$ and $CW_3$ are not written yet and their contents are in DON'T CARE states designated by x symbols in FIG. 10. In order to load the second column word $CW_1$ into the CML memory cells on the lines $sw_1$ and $w_1$, the FWDS and the SWDS are set respectively as $FWDS = \{0,0,0,1\}, \{0,1,1,0\}$ $SWDS = \{1,0,0\}$ The WRITE operation of the SEARCH part 1 is performed in synchronism with the clock CLK1 which has twice as frequency as the clock CLK2. When the TRUE output signal $\bar{Q}$ of the J/K flip-flop 500 which enters in common to all EXCLUSIVE- OR circuits 7 is logical 0 during a cycle of the clock CLK1, the WRITE input signals 131 of the selectors 13 are given by $\{0,0,0,1\}\{0,1,1,0\}$ As the selectors 13 are controlled to select the WRITE input signals 131 to the inverted outputs by means of the logical 1 at the line SL1, the bit lines $b_i$ (i=0,1, ..., 7) on the SEARCH array 14 are set as $\{1,1,1,0\}\{1,0,0,1\}$ Three bit lines $b_3$, $b_5$ and $b_6$ are activated to logical 0's. As the WRITE address input signals 60 are set {1,0}, the decoded output signals 61 becomes as {0,1,0,0} and only second sense-drive circuit 16 of the SEARCH part 1 can receive the write pulse signal at the line WPS1. Therefore, the logical 1 at the DRIVE input line (DI) which comes from the FALSE output $Q$ of the J/K flip-flop 500 are written into the CML memory cells 11 at intersections of $(b_3,sw_1)$, $(b_5,sw_1)$, $(b_6,sw_1)$.

When the TRUE output $\bar{Q}$ of the J/K flip-flop 500 becomes logical 1 during the secceeding next cycle of the clock CLK1, the WRITE input signals 131 of the selectors 13 equal the inverse of the given FWDS as $\{1,1,1,0\}\{1,0,0,1\}$ Therefore, the logical 0 at the DRIVE input line which is generated by means of Q=0 is written into the CML memory cells 11 at intersections of $(b_0,sw_1)$, $(b_1,sw_1)$, $(b_2,sw_1)$, $(b_4,sw_1)$ and $(b_7,sw_1)$. Thus, the FWDS is written into the CML memory cells 11 on the line $sw_1$ during two cycles of the clock CLK1.

On the other hand, the WRITE operation of the READ part 2 is performed in sychronism with the clock CLK2. The WRITE input signals 231 of the selector 23 of the READ part 2 equal to the decoded output signals 61 of the WRITE address decoder 6 as $\{0,1,0,0\}$ As the selector 23 is controlled to select the WRITE input signals 231 to the inverted output by means of the logical 1 at the line SL2, word lines $w_j$ (j=0,1,2,3) on the READ array 24 are set as $\{1,0,1,1\}$ Note that unlike the SEARCH part 1 only one word line $w_1$ is activated to logical 0 in the READ part 2. As all sense-drive circuits 26 of the READ part 2 receive in common the write pulse signal at the line WPS2, the DRIVE input signals 71 {1,0,0} which comes from the SWDS are written into the CML memory cells 21 on the word line $w_1$ activated to logical 0 during one cycle of the clock CLK2.

Next, the READ/WRITE operations of the R-PLA are considered electrically.

Figure 11:
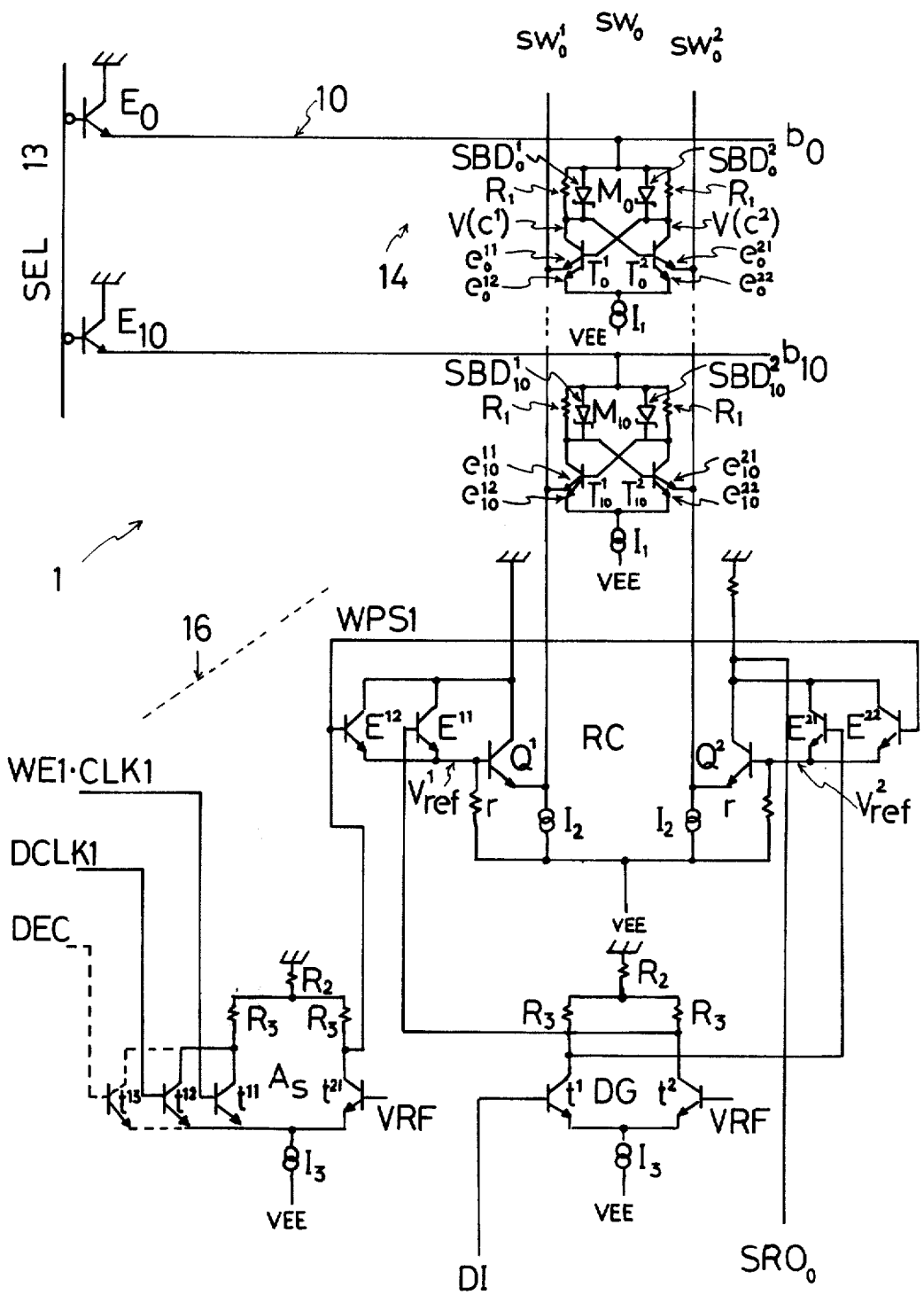
FIG. 11 shows a section of the SEARCH part of the R-PLA disclosed in this invention.

FIG. 11 shows a section of the SEARCH part 1 which containes two CML memory cells $M_0$ and $M_{10}$ existing at intersections ($b_0$, $sw_0$) and ($b_{10}$, $sw_0$) respectively on the SEARCH array 14, the sense-drive circuit 16 with a DRIVE gate (DG) and a reference circuit (RC) and the AND gate ($A_s$). Bit lines $b_0$ and $b_{10}$ come from emitter terminals of the transistors $E_0$ and $E_{10}$ respectively. Each base terminal of the transistors is connected to the corresponding inverted output line of the selector (SEL) 13 of the SEARCH part 1. Here, note that the subscript j in the representation of the cell $M_{ij}$ at intersection ($b_i$, $sw_j$) is omitted for clarity. Each CML memory cell $M_i$ (i=0, 10), which is interconnected to the bit line $b_i$ (i=0,10) and to a pair of sense-drive word lines $sw_0$, consists of the multi-emitter-type transistor $T_i^1$ and $T_i^2$ (i=0, 10), collector resistors with the value $R_1$, Schottky Barrier Clamp diodes $SBD_i^1$ and $SBD_i^2$ (i=0,10) and a constant current supply with the value $I_1$. Each sense-drive line ($sw_0^1$ or $sw_0^2$) is connected at the terminal to the sense-drive circuit 16 which consists of the reference circuit (RC) and the DRIVE gate (DG). The reference circuit to generate the READ output signal at the line $SRO_0$ contains the reference transistors $Q^1$ and $Q^2$, emitter follower transistors $E^{11}$, $E^{12}$, $E^{21}$, and $E^{22}$, resistors with the value r, and a constant current supply with the value $I_2$. The DRIVE gate to receive the DRIVE input signal from the line DI contains the transistors $t^1$ and $t^2$, three collector resistors which have the value $R_2$, $R_3$ and $R_3$, and a constant current with the value $I_3$. The AND gate $A_s$, which consists of the transistors $t^{11}$, $t^{12}$, $t^{13}$ and $t^{21}$, collector resistors with the values $R_2$, $R_3$, and the constant current supply with the value $I_3$, receives the AND signal (WE1.CLK1), the delay clock signal (DCLK1) and the decoded output signal (DEC) of the WRITE address decoder, and generates the write pulse signal at the output line WPS1.

Figure 12:
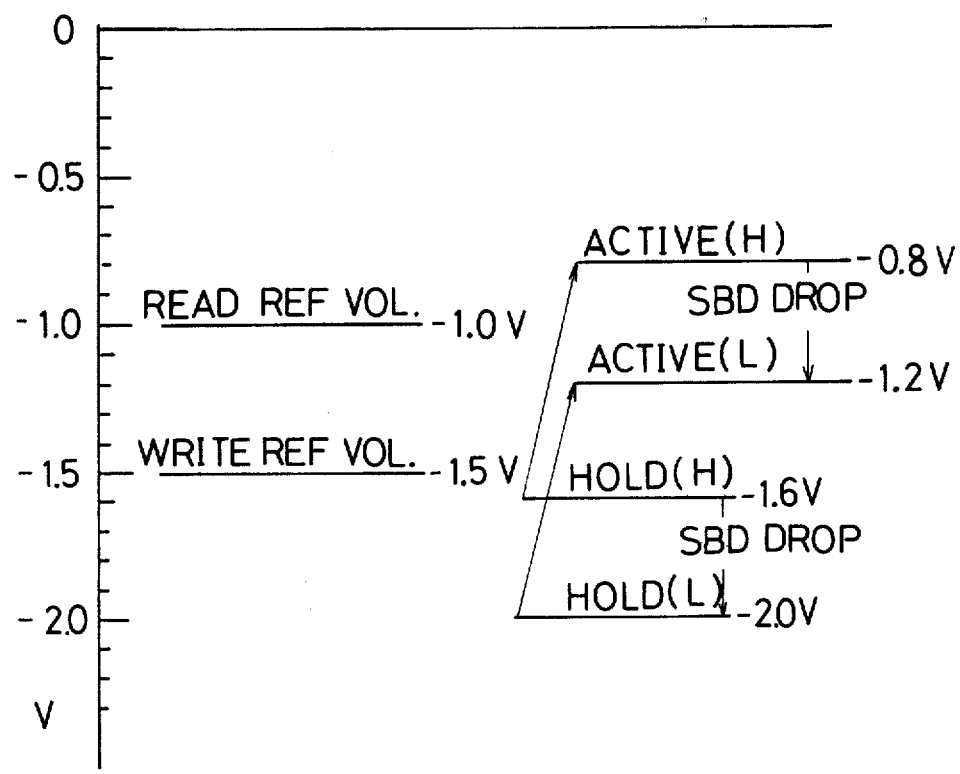
FIG. 12 shows an operating voltage level relations of the R-PLA disclosed in this invention.

FIG. 12 illustrates operating voltage level relations with respect to the circuits shown in FIG. 11.

When the WRITE ENABLE control signal designated by WE1 is HIGH voltage (logical 0) of the READ mode of the R-PLA, the transistor $t^{11}$ of the AND gate $A_s$ in FIG. 11 is ON and the voltage levels of the line WPS1 is $-R_2I_3$. The voltage levels of the base terminals of the transistors $E^{11}$ and $E^{21}$ in the reference circuit, which are determined by the collector voltages of the transistors $t^2$ and $t^1$ in the DRIVE gate respectively, are below $-R_2I_3$. Therefore, the reference voltages $V_{ref}^1$ and $V_{ref}^2$ on the base terminals of the transistors $Q^1$ and $Q^2$ are given, as shown in FIG. 12, by $$V_{ref}^1 = V_{ref}^2 = R_2I_3 - V_{be}(-1.0\ V) \tag{9}$$

where $V_{be}$ represents the forward voltage drop (about 0.8 V) between base and emitter of a bipolar transistor.

Let $V(b_i)$ be the voltage level of the bit line $b_i$ on the SEARCH array 14, it is assumed that $V(b_i)$ is given by $$V(b_i) = V_L - V_{be}(-1.6\ V)\ \text{or}\ V_H - V_{be}(-0.8\ V) \tag{10}$$

where $V_L$ and $V_H$ are LOW voltage and HIGH voltage corresponding to the logical 1 and the logical 0 respectively for the inverted output signals of the selector 13. It is also assumed that, in the circuits shown in FIG. 11, the transistors $T_0^1$ and $T_0^2$ of the cell $M_0$ are OFF and ON respectively, and the transistors $T_{10}^1$ and $T_{10}^2$ of the cell $M_{10}$ are OFF and ON respectively. In a general R-PLA, the content of the cell $M_{ij}$ ($i=0,1,\ldots,N-1; j=0,1,\ldots,1-1$) in the SEARCH array 14 is defined as the logic level corresponding to the collector voltage level of the left transistor $T_{ij}^1$ in the cell $M_{ij}$, $M_0$ and $M_{10}$ in the R-PLA shown in the FIG. 11 are said to be the 'cells with the content 0.

When the voltage $V(b_0)$ of the bit line $b_0$ in FIG. 11 is LOW (logical 1) at $V_L - V_{be}$ ($-1.6$ V), collector voltages $V(c^1)$ and $V(c^2)$ of the transistors $T_0^1$ and $T_0^2$ in the cell $M_0$ are given respectively, as shown in FIG. 12, by $$V(c^1) = V_L - V_{be}(-1.6\ V) \tag{11}$$

$$V(c^2) = V_L - V_{be} - V_{SBD}(-2.0\ V) \tag{12}$$

where $V_{SBD}$ is the forward voltage drop (about 0.4 V) of the SBD. The condition of the reference voltage such that the cell $M_0$ is in the HOLD state in the READ mode of the R-PLA is $$V_{ref}^1 = V_{ref}^2 = -R_2I_3 - V_{be}(-1.0V) > V_L - V_{be} = \tag{13}$$
$$V(c^1)\ (-1.6V).$$

When the HOLD condition (13) is satisfied, the first emitters $e_0^{11}$ and $e_0^{21}$ of the transistors $T_0^1$ and $T_0^2$ in the cell $M_0$ are CUT-OFF and the current does not flow at the emitters. Of course, the current $I_1$ flows through the second emitter $e_0^{22}$ of the ON transistor $T_0^2$ but not through the second emitter $e_0^{12}$ of the OFF transistor $T_0^1$.

If all cells on the line $sw_0$ were in the HOLD state, the voltage of the READ output line $SRO_0$ would be LOW level (logical 1) by means of the ON state of the reference transistor $Q^2$. But, note that in the READ mode of the R-PLA a plurality of bit lines 10 on the SEARCH array 14 are always activated to the HIGH voltage (logical 0) at $V_H - V_{be}$ ($-0.8$ V) at the same time according to the READ input signals 130 as described in the previous section.

When the voltage $V(b_0)$ of the bit line $b_0$ in FIG. 11 rises to the HIGH level (logical 0) at $V_H - V_{be}$ ($-0.8$ V), the collector voltages $V(c^1)$ and $V(c^2)$ of the transistors $T_0^1$ and $T_0^2$ in the cell $M_0$ become higher respectively, as shown in FIG. 12, as $$V(c^1) = V_H - V_{be}(-0.8\ V) \tag{14}$$

$$V(c^2) = V_H - V_{be} - V_{SBD}(-1.2\ V) \tag{15}$$

The condition of the reference voltage such that the content (i.e., collector voltage level $V(c^1)$ of the transistor $T_0^1$) of the cell $M_0$ can be read out is given, as shown in FIG. 12, by $$V_{ref}^1 = V_{ref}^2 = -R_2I_3 - V_{be}(-1.0V) > V_H - V_{be} = \tag{16}$$
$$V_{SBD} = V(c^2)\ (-1.2V),$$

$$V_{ref}^1 = V_{ref}^2 = -R_2I_3 - V_{be}(-1.0V) < V_H - V_{be} =$$
$$V(c^1)\ (-0.8V).$$

When the READ condition (16) is satisfied, the first emitters $e_0^{11}$ and $e_0^{21}$ of the transistors $T_0^1$ and $T_0^2$ of the cell $M_0$ are OFF and ON respectively. Therefore, since the reference transistor $Q^2$ becomes OFF, the voltage at the line $SRO_0$ is HIGH level (logical 0) at 0 voltage.

If the voltage $V(b_{10})$ of the another bit line $b_{10}$ rises to the HIGH level (logical 0) at $V_H - V_{be}$ ($-0.8$ V), the first emitter $e_{10}^{11}$ and $e_{10}^{21}$ of the transistors $T_{10}^1$ and $T_{10}^2$ in the another $M_{10}$ are also OFF and ON respectively.

Thus, in a general R-PLA, when a plurality of the bit lines 10 on the SEARCH array 14 are activated to the HIGH voltages (logical 0's) at $V_H - V_{be}$ ($-0.8$ V) at the same time according to the READ input signals 130, the READ current $I_R$ flow through each first ON emitter of each cell with content 0 to the line $sw_j$ ($j=0.1,\ldots,1-1$) is given by $$I_R = I_2/\alpha \tag{17}$$

Here, $\alpha$ represents the total number of the cells with content 0 on the line $sw_j$ and on the bit lines 10 activated in the READ mode to the HIGH voltages (logical 0's) at $V_H - V_{be}$ ($-0.8$ V). It is clear that, when the p-bit decoders are used as the bit partitioning networks 3 in a general R-PLA with n inputs, $\alpha$ satisfies $$1 \leq \alpha \leq n/p \tag{18}$$

where n/p is the number of the p-bit decoders.

On the other hand, when the WRITE ENABLE control signal designated WE1 in FIG. 11 is LOW voltage (logical 1) of the WRITE mode and the decoded output signal (DEC) of the WRITE address decoder 6 is also LOW voltage (logical 1), the write pulse signal is generated at the line WPS1 while both of the clock (CLK1) and the delay clock (DCLK1) are LOW voltage. The voltage level of the write pulse signal generated at the line WPS1 by switching transistor $t^{21}$ of the AND gate $A_s$ to the ON state is $-R_2I_3 - R_3I_3$.

If the voltage level of the DRIVE input signal (DI) inputted at the base terminal of the transistor $t^1$ in the DRIVE gate is LOW (logical 1), the voltage levels of the base terminals of the transistors $E^{11}$ and $E^{21}$ are $-R_2I_3 - R_3I_3$ and $-R_2I_3$ respectively. Therefore, the reference voltage $V_{ref}^1$ and $V_{ref}^2$ of the base terminals $Q^1$ and $Q^2$ are given respectively, as shown in FIG. 12, by $$V_{ref}^1 = -R_2I_3 - R_3I_3 - V_{be}(-1.5\ V) \tag{19}$$

$$V_{ref}^2 = -R_2I_3 - V_{be}(-1.0\ V) \tag{20}$$

When the voltage $V(b_0)$ of the bit line $b_0$ is LOW level (logical 1) at $V_L - V_{be}$ (−1.6 V), both collector voltages $V(c^1)$ and $V(c^2)$ of the transistors $T_0^1$ and $T_0^2$ in the cell $M_0$ are given by equations (11) and (12) respectively. Therefore, the condition of the reference voltage such that the cell $M_0$ remains in the HOLD state also in the WRITE mode of the R-PLA is given, as shown in FIG. 12, by $$V_{ref}^1 = -R_2I_3 - R_3I_3 - V_{be}(-1.5V) > V_L - V_{be} = \quad (21)$$
$$V(c^1)(-1.6V).$$

It is clear that if the condition (21) is satisified the condition (13) is satisfied.

When the $V(b_0)$ of the bit line $b_0$ in the FIG. 11 rises to the HIGH level (logical 0) at $V_H - V_{be}$ (−0.8 V), the collector voltage $V(c^1)$ and $V(c^2)$ of the transistors $T_0^1$ and $T_0^2$ in the cell $M_0$ become higher as indicated by equations (14) and (15) respectively. Therefore, the condition of the reference voltage such that the content (i.e., collector voltage level $V(c^1)$ of the transistor $T_0^1$) of the cell $M_0$ can be changed from the logical 0 (HIGH voltage) to the logical 1 (LOW voltage) is given, as shown in FIG. 12, by $$V_{ref}^1 = -R_2I_3 - R_3I_3 - V_{be}(-1.5V) < V_H - V_{be} = \quad (22)$$
$$V_{SBD} = V(c^2)(-1.2V).$$

When the WRITE condition (22) is satisfied, the transistors $T_0^1$ and $T_0^2$ of the cell $M_0$ change from OFF to ON and ON to OFF respectively since the WRITE current $I_w$ flows through the emitter $e_0^{11}$ to the line $sw_0^1$.

Here, note that also in the WRITE mode of the R-PLA a plurality of the bit lines 10 on the SEARCH array 14 are activated to the HIGH voltages (logical 0's) at $V_H - V_{be}$ (−0.8 V) at the same time according to the WRITE input signals 131 as described in the previous section. If the voltage $V(b_{10})$ of the another bit line $b_{10}$ rises to the HIGH level (logical 0) at $V_H - V_{be}$ (−0.8 V) at the same time as the HIGH voltage $V(b_0)$, the transistors $T_{10}^1$ and $T_{10}^2$ in the another cell $M_{10}$ also change from OFF to ON and ON to OFF respectively since the WRITE current $I_w$ flows through the emitter $e_{10}^{11}$ to the line $sw_0^1$.

Thus, in a general R-PLA, when a plurality of the bit lines 10 on the SEARCH array 14 are activated in the WRITE mode to the HIGH voltages (logical 0's) at $V_H - V_{be}$ (−0.8 V) at the same time according to the WRITE input signals 131 and the LOW voltage (logical 1) is inputted at the DRIVE input line (DI), the WRITE current $I_w$ to flow through each first ON emitter of each cell with the content 0 to the line $sw_j$ (j=0,1, ..., l−1) is given by $$I_w = I_2/\beta \quad (23)$$

Here, $\beta$ represents the total number of the cells with the content 0's on the line $sw_j$ and on the bit lines activated in the WRITE mode to the HIGH voltages (logical 0's) at $V_H - V_{be}$ (−0.8 V). It is clear that, when there exists N bit lines 10 on the SEARCH array 14 in a general R-PLA, $\beta$ satisfies $$1 \leq \beta \leq N. \quad (24)$$

Also, the WRITE current to standby current ratio $I_w/I_1$ to change the content of a CML memory cell sufficiently must be $$I_w/I_1 \leq 1 \quad (25)$$

The READ/WRITE operations of the READ part 2 in the R-PLA will be proved electrically similar to those of the SEARCH part 1 discussed above. Noting that the number of word lines 20 activated to the HIGH voltages (logical 0's) at $V_H - V_{be}$ (−0.8 V) is only one in the WRITE mode of the READ part 2, the relation of the currents $I_1'$ and $I_2'$ corresponding to the currents $I_1$ and $I_2$ for the SEARCH part 1 respectively is given, as a condition to change the content of a CML memory cell, by $$I_2'/I_1' > 1 \quad (26)$$

Also, in the READ mode of the READ part 2, the number of word lines 20 activated to the HIGH voltages (logical 0's) at $V_H - V_{be}$ (−0.8 V) is 0 from l where l is the number of word lines 20 of the general R-PLA.

Therefore, the current $I_2$ for the SEARCH array 14 and the current $I_2'$ for the READ array 24 will be determined approximately as $$I_2 \approx N\,I_1,\ I_2' \approx l\,I_1' \quad (27)$$

Owing to the existence of the conditions (27), the problem for the design of the R-PLA is the reduction of power dissipation rather than the speed.

Figure 13:
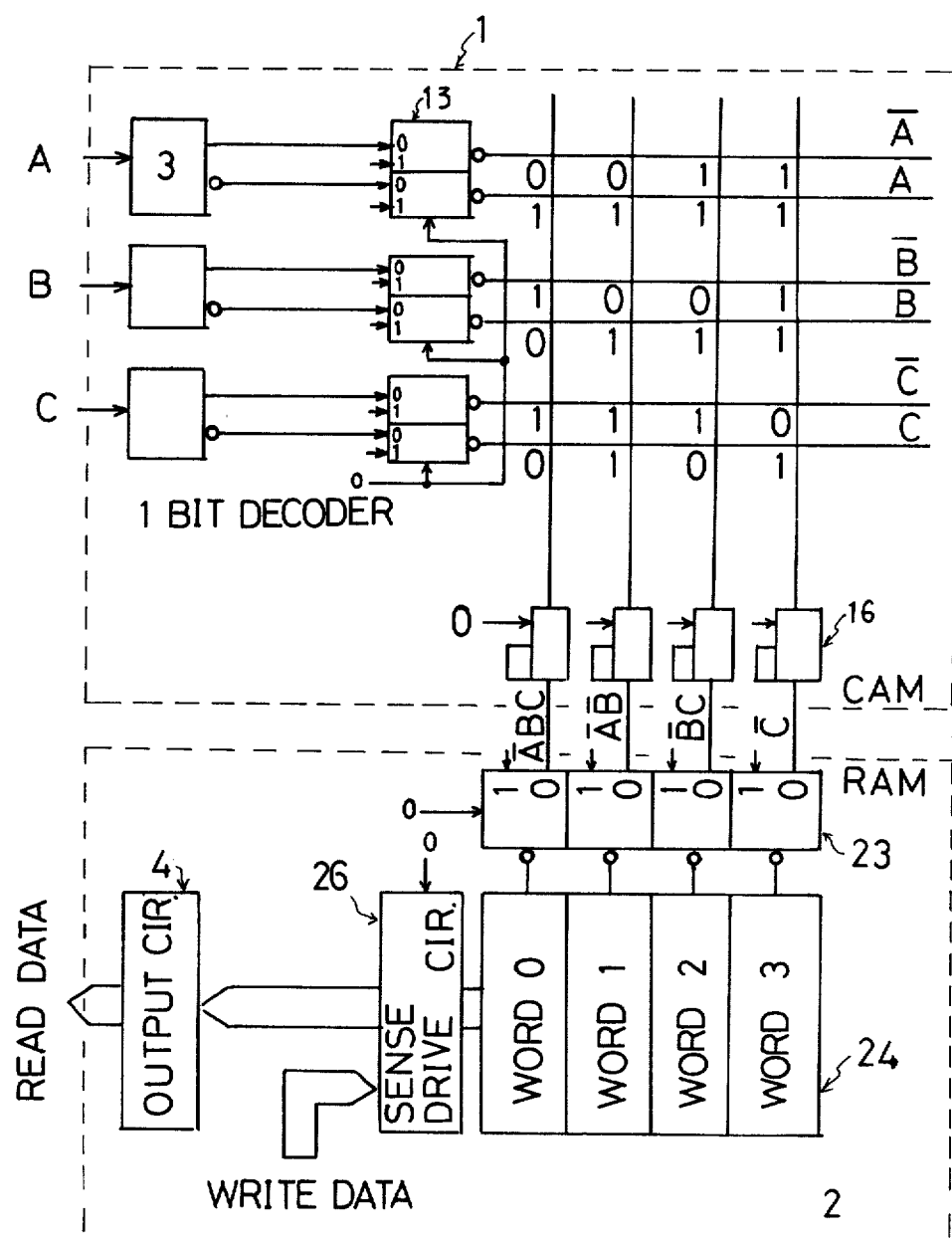
FIG. 13 shows a maskable associative memory realized by using the R-PLA disclosed in this invention.

The R-PLA with 1-bit decoders shown in FIG. 13 is identified with a maskable Content Addressable Memory (CAM). The Boolean product represented at each READ output line of the SEARCH part 1 (i.e., CAM) is obtained by selecting the appropriate output from each 1-bit decoder and ANDing all of these together. The personality associated with any given variables A, B, and C can be $(_1{}^0)$, $(_0{}^1)$ or $(_1{}^1)$. The personality $(_0{}^0)$ is not normally used. For the personality $(_1{}^1)$, we have a DON'T CARE situation for that particular variable. This is functionally equivalent to 'mask' the variable. That is, for a variable A, the parsonalities $(_1{}^0)$, $(_0{}^1)$ and $(_1{}^1)$ represent A=0, A=1 and the mask of A. In the READ part 2 which works as a RAM in FIG. 13, a word addressed by means of the match for the input and the product can be readout.

Also, a functional logic such as an arithmetic logic unit which requires large number of cells to realized by using a read-only type of the conventional PLA in a single cycle will be realized by using the R-PLA in many cycles.

When the R-PLA is used as a control store, a high performance system with a dynamic microprogramming such as a debugging machine [4] will be established in future.

References:
1. H. Fleisher and L. I. Maissel, "An Introduction to Array Logic," IBM Journal of Research and Development, Vol. 19, No. 2, pp. 98–109, March, 1975.
2. P. L. Gardner, "Functional Memory and its Microprogramming Inplications," IEEE Trans. Comp., Vol. 20, No. 7, pp. 764–775, July, 1971.
3. J. W. Jones, "Array Logic Macro," IBM Journal of Research and Development, Vol. 19, No. 2, pp. 120–126, March, 1975.

4. K. Sakamura, H. Kitafusa, Y. Takeyari and H. Aiso, "A Debugging Machine—An Approach to an Adaptive Computer," Proceedings of IFIP Congress 77, Toronto, August 8–12, 1977, pp. 23–28.

These references are referred to at various places in the foregoing sepcification by their identification numeral in brackets.

What is claimed is:

1. A rewritable programmable logic array (R-PLA), which loads a word pattern of bit personalities to generate specific logic function into memory cells from the word direction comprising:
    a SEARCH array (14) comprising bit lines (10), sense-drive word lines (15) having end terminals thereon and multi-emitter type bistable Current Mode Logic (CML) memory cells (11) at all intersections of said bit lines with said sense-drive word lines;
    a READ array (24) comprising word lines (20), sense-drive bit lines (25) having end terminals thereon and multi-emitter type bistable CML memory cells at all intersections of said word lines with said sense-drive word lines;
    a first two-channel selector (13) comprising first READ inputs (130) and first WRITE inputs (131) to which input signals are respectively supplied, the outputs of said first selector being connected to said bit lines of said SEARCH array;
    first sense-drive circuits (160) operable in a READ mode and a WRITE mode connected to said terminals of said sense-drive word lines of said SEARCH array, having first DRIVE inputs (161) and first WRITE pulse signal inputs (160) respectively receiving signals in said WRITE mode and having first READ outputs (12) for generating AND-function signals in response to said first READ inputs of said first selector in said READ mode;
    a second two-channel selector (23) comprising second READ inputs (230) and second WRITE inputs (231) to which input signals are respectively supplied, and second READ inputs of said second selector being connected to said first READ outputs of said first sense-drive circuits, the outputs of said second selector being connected to said word lines of said READ array;
    second sense-drive circuits (26) operable in a READ mode and a WRITE mode connected to said terminals of said sense-drive bit lines of said READ array, having second DRIVE inputs (261) and second WRITE pulse signal inputs (260) respectively receiving signals in said WRITE mode and having second READ outputs (22) for generating AND-function signals in response to said second READ inputs of said second selector in said READ mode;
    bit partitioning networks (3) having inputs (30) for receiving input variables and having outputs (130) connected to said first READ inputs of said first selector to deliver signals to said first selector;
    a WRITE address decoder (6) having inputs (60) for receiving WRITE address signals and outputs (61) connected, through means (8) for generating said first WRITE pulse signals, to said first WRITE pulse signal inputs of said first sense-drive circuit and also connected to said second WRITE inputs of said second selector,
    first READ/WRITE control circuits (5, 6, 7 and 8) including said means for generating said first WRITE pulse signals and connected to said first WRITE inputs to a selected control lines (SLI) of said first selector and to said first sense-drive circuits; and
    second READ/WRITE control circuits (5, 9) connected to said second selector and also to said second sense-drive circuits;
    whereby AND-functions are conducted by using one multi-emitter of a transistor in each said CML memory cell and an emitter of a reference transistor in each of said sense-drive circuits in the READ mode of said R-PLA.

2. The R-PLA according to claim 1 wherein the said first and second READ/WRITE control circuits include means to let a word pattern of the said bit personalities load into the said CML memory cells existing along said sense-drive word lines on said SEARCH array and along said word lines in the said READ array respectively in the WRITE mode of the R-PLA.

3. The R-PLA according to claim 2 in which said means for letting the said bit personalities load into the said cells comprises EXCLUSIVE-OR circuits (7), the first of two inputs of each said EXCLUSIVE-OR circuit receiving each bit of said bit personalities to be stored in the said CML memory cells on said SEARCH array and the output of each of one of said EXCLUSIVE-OR circuits being connected to each of one of said first WRITE inputs of said first two-channel selector.

4. The R-PLA according to claim 3 in which said means for letting the said bit personalities load into the said cells comprises a J/K flip-flop (500), the true output of the said J/K flip-flop being inverted in turn by a trigger input and connected to the second of said two inputs of each said EXCLUSIVE-OR circuit, and the false output of the said J/K flip-flop being connected to each of said first DRIVE inputs of said first sense-drive circuits.

* * * * *